United States Patent
König et al.

(10) Patent No.: US 6,235,416 B1
(45) Date of Patent: May 22, 2001

(54) COMPOSITE BODY AND PRODUCTION PROCESS

(75) Inventors: Udo König, Essen; Hartmut Westphal, Dermbach/Rhön; Volkmar Sottke, Mülheim, all of (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/331,562
(22) PCT Filed: Dec. 10, 1997
(86) PCT No.: PCT/DE97/02889
  § 371 Date: Feb. 21, 1999
  § 102(e) Date: Jun. 21, 1999
(87) PCT Pub. No.: WO98/31846
  PCT Pub. Date: Jul. 23, 1998

(30) Foreign Application Priority Data

Jan. 21, 1997 (DE) .............................. 197 01 863
Mar. 7, 1997 (DE) .............................. 197 09 300
Aug. 28, 1997 (DE) .............................. 197 37 470

(51) Int. Cl.⁷ .......................................... B32B 9/00
(52) U.S. Cl. .................. 428/701; 428/702; 428/469; 428/472; 428/472.2; 428/408; 427/419.2; 427/419.7; 427/249.1; 427/249.17; 427/249.19; 427/255.11; 427/255.19
(58) Field of Search ........................ 428/469, 472, 428/472.2, 701, 702, 408; 427/419.2, 419.7, 249.1, 249.17, 249.19, 255.11, 255.19

(56) References Cited

U.S. PATENT DOCUMENTS 4,714,660  12/1987  Gates, Jr. .
5,981,078  * 11/1999  Tabersky .

FOREIGN PATENT DOCUMENTS

| 397 626 | 5/1994 | (AT) . |
| 25 05 009 A1 | 8/1975 | (DE) . |
| 34 46 455 A1 | 6/1986 | (DE) . |
| 37 38 081 A1 | 5/1989 | (DE) . |
| 44 11 475 A1 | 10/1995 | (DE) . |
| 53116207 | 10/1978 | (JP) . |
| 4357174 | 12/1992 | (JP) . |

* cited by examiner

Primary Examiner—Deborah Jones
Assistant Examiner—Wendy Boss
(74) Attorney, Agent, or Firm—Herbert Dubno

(57) ABSTRACT

A composite in which a substrate body is coated with a single layer or multiple layers and at least one layer has two or three phases comprised of cubic ZrCN and monoclinic or tetragonal $ZrO_2$. The composite can be in the form of a lathe or milling cutter cutting insert.

25 Claims, 1 Drawing Sheet

COMPOSITE BODY AND PRODUCTION PROCESS

CROSS REFERENCE TO RELATED APPLICATIONS

This application is a national phase of PCT/DE 97/02889 filed Dec. 10, 1997 and based upon German national applications 197 01 863.7 of Jan. 21, 1997, 197 09 300.0 of Mar. 7, 1997 and 197 37 470.0 of Aug. 28, 1997 of the International Convention.

FIELD OF THE INVENTION

The invention relates to a composite body which is comprised of a substrate body with a monolayer or multilayer coating.

The invention relates further to a process for producing a layer on a substrate body of a hard metal, cermet or a ceramic.

BACKGROUND OF THE INVENTION

The first coatings, according to the state of the art, which allowed an improved wear prevention against free surface wear to be obtained, were comprised of titanium carbide with a thickness up to 8 $\mu$m. Further, double or multiple coatings of titanium carbide and titanium nitride, especially with titanium nitride as an outermost layer, are known in the art for reduced cratering when the product is used as a cutting insert in machining. For further improvement of such cutting inserts, multilayer coatings of the layer sequence TiC, Ti(C,N), TiN, have been proposed. It has been found that the natural brittleness of ceramics, like $Al_2O_3$ can be minimized when $Al_2O_3$ is applied in a thin layer form and thus, TiCTi(C,N) and an outer layer of $Al_2O_3$ have been provided as multiple coatings. While the patent literature, for example EP 0 299 282 B1 describes in special cases the use of carbides, nitrides and/or carbonitrides of the elements titanium, zirconium, hafnium, vanadium, niobium and/or tantalum, these have been described only as useful in an example with titanium compounds as coating materials, in part in combination with aluminum oxide. The same is true with the description of $ZrO_2$ in the combination with or as a replacement for oxide coatings. DE 36 20 901 A1 or EP 0 250 865 A1 which has the same content, describes for the first time a cutting tool whose cutting edge is coated with titanium carbide, titanium carbonitride and/or titanium nitride and whose outermost cover layer is composed of a thin zirconium nitride layer. The zirconium nitride, which has poorer wear characteristics than the aforementioned titanium compounds should hinder the oxidation of the base layer underlying this coating by atmospheric oxygen, whereby the good wear characteristics of the titanium carbide, titanium carbonitride and/or titanium nitride coatings can be fully maintained.

By contrast, in U.S. Pat. No. 3,854,991 (or CH A 585273) a coating of a sintered hard metal product is described in which the coating is comprised of HfCN and/or ZrCN and has an X-ray diffraction lattice constant which in the case of HfCN and a mixture of HfCN and ZrCN lies between 4.5570 and 4.630 angstrom and in the case of ZrCN lies between 4.6 and 4.62 angstrom. In the case of ZrCN the CN ratio is clearly less than 1. For the production of these hafnium or zirconium carbonitrides, a hafnium halogenide and/or a zirconium halogenide can be fed over a substrate together with hydrogen, nitrogen and a hydrocarbon at a temperature of 1000 to 1300° C.

U.S. Pat. No. 4,714,660 describes a cutting insert of a CVD-coated substrate body in which the first CVD layer is comprised of at least two phases deposited simultaneously together, of which the first is composed of a member of the group of carbides, carbonitrides, nitrides, oxycarbides, oxycarbonitrides, suicides or borides of titanium, zirconium, hafnium, vanadium, niobium or tantalum, or a carbidesilicide or boride of chromium, molybdenum or tungsten, or a silicon or boron carbide and a second of these phases is selected from the group of oxides or oxynitrides of aluminum, titanium, zirconium, hafnium, magnesium, silicon and calcium or very stabilized zirconium oxide.

Of the deposited mentioned phases, at least one of the phases is composed of fibers, spikes or column-shaped particles with an elongated axial orientation extending in a direction which is perpendicular to the substrate/coating surface of the composite.

OBJECT OF THE INVENTION

It is an object of the present invention to provide a composite body of the type described at the outset which has a high microhardness, good wear characteristics, especially in chip removal machining operations like turning or milling, or hard abrasively loaded wear hardness.

SUMMARY OF THE INVENTION

This object is achieved with the composite body which, according to the invention, is characterized in that at least one layer has two or three phases which are comprised of cubic ZrCN and monoclinic and/or tetragonal $ZrO_2$.

In the CVD deposition of TiCN, when oxygen is contained in the gas atmosphere, it is incorporated in the (single phasic) lattice whereby Ti(C,O,N) deposits result. The presence of oxygen in the gas phase results in the deposition of two adjoining phases in the coating, namely, ZrCN and $ZrO_2$ when certain boundary conditions are maintained. This can be expected from the chemical similarity of zirconium and titanium, which both are from the same group of the periodic system, along with good adherence of the resulting coating on the substrate body or on another layer or as an intermediate layer. The new coating has been found even with composite bodies which are formed as cutting inserts, to give rise to significant improvements in the useful life of the insert in the milling of steel. The useful life, e.g. as a steel milling insert, can be increased by about 30%. Further this coating is suitable in a significant manner for the efficiency improvement of deformation shaping tools which are subject to friction wear.

Thickness of the layer according to the invention should be between 2 and 10 $\mu$m, preferably at least 3 $\mu$m. Based on the different characteristics of the ZrCN on the one hand and the $ZrO_2$ on the other, known in the art, which can be advantageously used, it is another basic thought of the invention established in the layer a gradient of the relative $ZrO_2$/ZrCN proportions. Depending upon the desired boundary zone, for example, the $ZrO_2$ content in the layer can decrease outwardly. For example for the machining of castings, a higher ZrCN content is advantageous whereas in the use of a ZrCN/$ZrO_2$ layer as an outer layer or a single layer for cutting inserts which are to be used for machining castings, the $ZrO_2$ relative content toward the exterior can be decreased preferably to zero. Conversely the adhesion of $ZrO_2$ to substrate bodies as well as to other layers is in part better than that of ZrCN so that the $ZrO_2$ component can increase inwardly, preferably to the boundary with the substrate body, growing, for example up to 100%. The gradient adjustment can be carried out during the CVD coating by adjusting the $CO_2$ content as a function of time.

Apart from the aforedescribed boundary zones, it is preferred, especially with a two phase coating that there be a homogeneous distribution of the relative mass proportions of $ZrO_2$ between 5 and 75 mass %, preferably between 5 and 60% and most preferably between 20 and 40%. The $ZrO_2$ proportion which is selected in the layer can be chosen in consideration of the purpose for which the composite body is to be used and set accordingly. Furthermore, the ratio of monoclinic to tetragonal $ZrO_2$ can be varied via the coating geometry. Preferably this ratio is in the range of (3 to 4):(7 to 6). Thus at a coating temperature of about 950°, it is possible to obtain ⅔ of the $ZrO_2$ component as tetragonal $ZrO_2$ in addition to the Zr(C,N) phase. At higher temperatures the tetragonal $ZrO_2$ proportion grows and can reach 100% at a coating temperature of about 1100° C. The ZrCN phase is present in cubic form.

The substrate body, upon which one or more layers can be coated, of which one can be the coating of the invention, can be composed of hard metal, cermet or a ceramic. The coating can be a multilayer coating and apart from the layer of $ZrCN/ZrO_2$ can comprise at least one layer of a carbide, nitride and/or carbonitride of an element from group IVa or Group Va or group VIa of the periodic system, and optionally also a coating of $Al_2O_3$ and/or $ZrO_2$, whereby dioxide layers can form the outermost layer and also a layer underlying the $ZrCN/ZrO_2$ layer when that is outermost. Finally a diamond-like layer can be used as the outer layer. In a preferred use the outer layer is comprised of a $ZrCN/ZrO_2$ layer under which an $Al_2O_3$ layer can be provided. Good wear characteristics on machining can also be obtained with the following layer sequence (given from inner side to outer side):

TiN: 0.5 to 2 μm, preferably up to 1 μm; TiCN: 2 to 5 μm, $ZrCN/ZrO_2$: 2 to 10 μm.

Preferably the coating of the invention is composed of ZrCN and $ZrO_2$, optionally in combination with other layers of other compositions, is applied by means of CVD deposition on a coated or uncoated substrate body composed of a hard metal, a cermet or a ceramic, at a temperature between 800° and 950° with a Zr-halogenide in stoichiometric excess in the gas phase, $CO_2$, hydrogen, and a material with a C—N group as a carbon and nitrogen donor at a pressure between 5 kPa and 100 kPa. For CVD deposition, a Zr halogenide, especially $ZrCl_4$, in a stoichiometric excess, $CO_2$, $H_2$ and a material with a C—N group as a carbon and nitrogen donor, are admitted at a pressure between 5 kPa and 100 kPa and at a temperature between 800° C. to 950° C. The stoichiometric excess of the zirconium halogenide is required to suppress the deposition of carbon (soot). The material serving as a C—N donor preferably has a cyanide group with a triple bond between the carbon and the nitrogen whose bond spacing at room temperature is between 0.114 and 0.118 nm. Such compounds can be hydrogen cyanide, cyanamide, cyanogen, cyanoacetylene, or acetonitrile. Alternatively or in part, such gaseous compounds can also be used which have CN molecular groups with a simple bond between the carbon and the nitrogen, like, for example, methylamine and ethylenediamine. Basically also the compounds described in DE 25 05 009 A1 can be used. Alternatively it is also possible to gate into the reaction vessel such materials which are capable of forming such cyanide groups at the abovementioned reaction temperatures. Preferably the coating temperature, i.e. the temperature of the substrate body to be coated or the substrate body which has already been coated with one or more layers, is between 900° C. and 920° C. In the course of the coating, preferably the $CO_2$ proportion in the gas atmosphere is lowered so that the phase proportion of the $ZrO_2$ in the $ZrCN/ZrO_2$ layer is reduced progressively with time so that a gradient is formed in the layer. By reducing the $CO_2$ proportion to 0, the $ZrO_2$ proportion can be reduced also to 0 in a corresponding way. Conversely, increasing the $CO_2$ proportion and correspondingly decreasing the proportion of the C—N donor, the $ZrO_2$ proportion in the coating can be increased.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
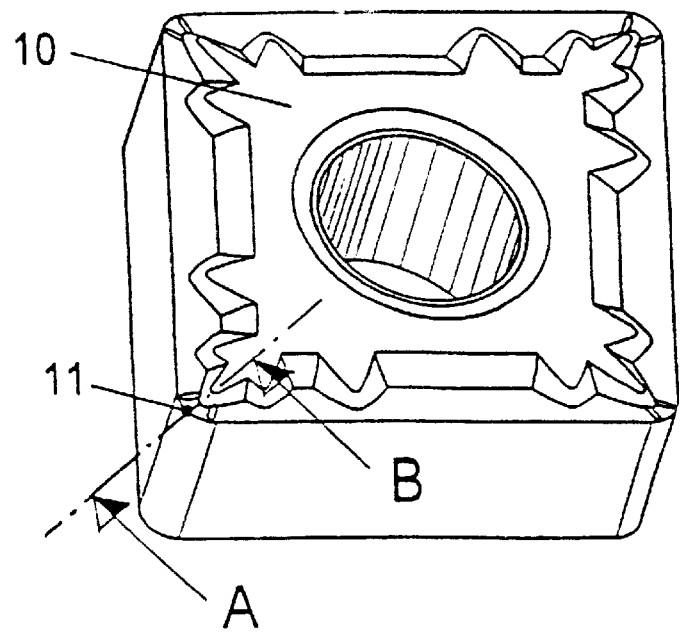
FIG. 1 is a perspective view of a cutting insert according to the invention.
Figure 2:
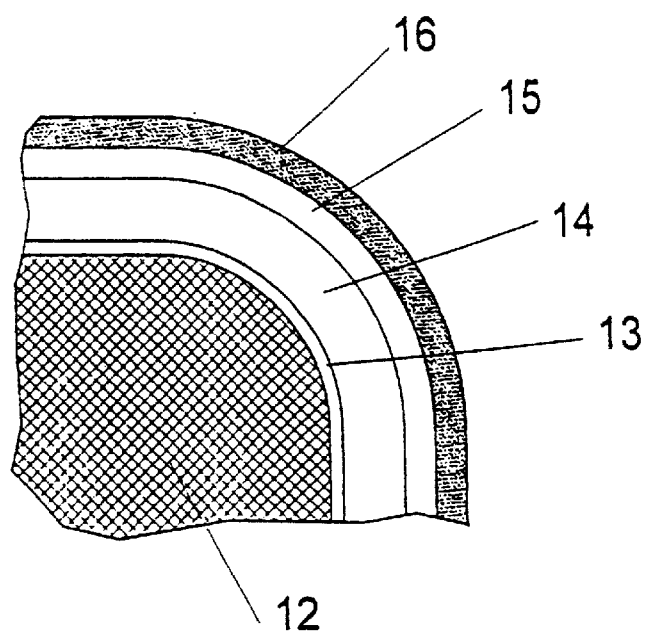
FIG. 2 is a section along line A-B if FIG. 1, drawn to a larger scale.

FIG. 1 shows a cutting insert 10 whose cutting corner 11 is shown in section in FIG. 2 schematically in a cut taken along the line A-B in FIG. 1.

As can be seen from FIG. 2, a first 1 μm thick layer 13 of TiN, a second 4 μm thick layer 14 of TiCN, a third 2 μm thick layer 15 of $Al_2O_3$ and an outer 3 μm thick cover layer 16 of $ZrCN/ZrO_2$ are applied to a substrate body 12 which is comprised of a WC hard metal with 6% cobalt as a binder.

In a further series of tests, 1000 lathe cutting plates with the designation CNMG 120412-49 of a substrate base body are coated. The hard metal alloy serving as the substrate base body is comprised of 93.9 mass % WC and 6.1 mass % Co. The coating is carried out by the CVD process in an apparatus which permits temperature adjustment to 1100° C. and pressures between 5 kPa and 100 kPa. In the coating apparatus the following gases can be introduced: hydrogen, nitrogen, carbon dioxide, methane, acetonitrile, titanium tetrachloride, zirconium tetrachloride and aluminum trichloride.

Half of the substrate bodies were coated at 990° C. with a multilayer coating of the following individual layers:

| Individual Layer | Thickness (μm) | Gases Used |
| --- | --- | --- |
| TiN | 1.5 | $H_2$, $N_2$, $TiCl_4$ |
| Ti(C,N) | 4.5 | $H_2$, $N_2$, $CH_4$, $TiCl_4$ |
| $Al_2O_3$ | 3.0 | $H_2$, $CO_2$, $AlCl_3$ |
| TiN | 1.0 | $H_2$, $N_2$, $TiCl_4$ |
| Total thickness | 10.0 μm. | |

The aforementioned coating is known from the art. In a further coating series, the mentioned substrate bodies are provided at 990° C. with a multilayer coating of the following individual layers:

| Individual Layer | Thickness (μm) | Gases Used |
| --- | --- | --- |
| TiN | 1.5 | $H_2$, $N_2$, $TiCl_4$ |
| Ti(C,N) | 4.5 | $H_2$, $N_2$, $CH_4$, $TiCl_4$ |

-continued

| Individual Layer | Thickness (μm) | Gases Used |
|---|---|---|
| Zr(CN)/ZrO$_2$ | 3.6 | H$_2$, CH$_3$CN, CO$_2$, ZrCl$_4$ |
| Total thickness | 9.6 μm. | |

In the first and second coating series, the first layer of TiN and the second layer of Ti(C,N) are in common. Only the outer layers are different and in one case consist of an Al$_2$O$_3$ coating and an outer TiN layer and in the case of the invention, of the layer according to the invention of ZrCN and ZrO$_2$. The last-mentioned coating was analyzed whereby with the aid of an optical microscope and a scanning electron microscope it was observed that with use of the reaction gases H$_2$, CH$_3$, CO$_2$ and ZrCl$_4$, the individual layers comprised two different phases which could be determined by X-ray diffractometry to be cubic zirconium carbonitride and monoclinic zirconium oxide. This result is surprising because normally with CVD deposition from gas mixtures which theoretically would be suitable for the deposition of two or more materials, in practice only one material is deposited, namely the phase which is most thermodynamically stable. In further tests this has been confirmed by CVD deposition from a gas mixture of H$_2$, CH$_4$, N$_2$, CO$_2$ and ZrCl$_4$. The deposited layer substantially consists of ZrO$_2$ and has a hardness less than that of the ZrCN/ZrO$_2$ coating of the invention. This shows that for the deposition of the coating according to the invention, the material with a C—N group as the carbon and nitrogen donor must be present.

According to the invention it is also possible to vary the gas composition during the coating, for example by varying the proportions of the relative gas contents CH$_3$CN/CO$_2$. In this manner, especially in the lower part of the last layer, a greater proportion of ZrCN and in the upper part an enrichment in ZrO$_2$ can be produced.

Each group of the aforementioned lathe cutting plates with the coating TiN, Ti(C,N), Al$_2$O$_3$ and TiN, as representatives of state of the art cutting inserts, and those with a coating according to the invention of TiN, Ti(C,N), Zr(C,N)/ZrO$_2$ are used to turn a shaft of a diameter of 300 mm of a ductile steel composition X5CrNi1810 (stainless steel). The respective cutting plates had total coating thicknesses which did not differ from one another by more than 0.4 μm. The following cutting conditions applied:

| | |
|---|---|
| Cutting speed | v$_c$ = 160 m/min |
| Cutting depth | a$_p$ = 2 mm |
| Feed | f = 0.4 mm/rotation. |

With the cutting plates of the state of the art, cutting durations on an average of 12 minutes were obtainable. For the cutting plates of the invention the cutting duration was 18.5 minutes on average. These results showed that the cutting inserts according to the invention had significantly better wear properties.

In a further example, a punching die was fabricated with an outer coating according to the invention of ZrCN and ZrO$_2$. This coating was found to provide a dry lubrication effect which was attributed to the effect of ZrO$_2$ as a dry lubricant and was characterized by an especially low chemical affinity to metallic materials in shaping processes which did not involve chip removal.

In the production of valve stems for auto engines which were composed of Co—Ni superalloy, the valve stems before shaping were heated to about 600° C. and then introduced into a hard metal die of WC with 15 mass % cobalt. After about 10000 stampings, the die had to be repolished.

In a second procedure, the hard metal die of WC with 15 mass % cobalt was coated with 1.5 μm TiN and 5 μm ZrCN/ZrO$_2$ in which the ZrO$_2$ component was ⅖ in monoclinic form and ⅗ in tetragonal form. 124 processed pieces showed that the die would require after polishing only after 50000 operations. The coating of the invention thus showed that tools operating without chip removal also had a significantly improved life.

What is claimed is:

1. A composite body comprised of a substrate body with a monolayer or multilayer coating wherein at least one layer has two or three phases comprised of a cubic ZrCN and monoclinic and/or tetragonal ZrO$_2$.

2. The composite body according to claim 1 wherein said at least one layer is a ZrCN/ZrO$_2$ layer having a thickness of at least 2 μm.

3. The composite body defined in claim 2 wherein said thickness is 3 μm to 10 μm.

4. The composite body according to claim 1 wherein said at least one layer is a ZrCN/ZrO$_2$ and a mass ratio of ZrCN to ZrO$_2$ in the ZrCN/ZrO$_2$ layer varies with distance from a boundary surface between said body and said coating.

5. The composite body according to claim 4 wherein the ZrO$_2$ content of the ZrCN/ZrO$_2$ layer which is a single layer or the outermost layer, decreases outwardly.

6. The composite body defined in claim 5 wherein the ZrO$_2$ content in said at least one layer decreases outwardly to zero.

7. The composite body according to claim 4 wherein the ZrCN/ZrO$_2$ layer is a first of a plurality of layers or is an outermost layer and has a ZrO$_2$ proportion increasing inwardly to 100%.

8. The composite body according to claim 1 wherein a relative mass proportion of the ZrCN/ZrO$_2$ phase in said coating is between 5 and 75 mass %.

9. The composite body defined in claim 8 wherein said relative mass proportion is between 15 and 60 mass %.

10. The composite body defined in claim 9 wherein said relative mass proportion is between 20 and 40 mass %.

11. The composite body according to claim 1 wherein said one layer has a ratio of monoclinic to tetragonal ZrO$_2$ of (3 to 4): (7 to 6) and the ZrCN in said one layer is present in cubic form.

12. The composite body according to claim 1 wherein the substrate body is comprised of hard metal, a cermet or a ceramic.

13. The composite body according to claim 1 wherein the substrate body is coated with a multilayer coating and at least one layer of said coating is comprised of carbides, nitrides and/or carbonitrides of an element from group IVa, group Va or group VIa of the periodic system and/or from Al$_2$O$_3$ and/or ZrO$_2$ or a diamond-like layer.

14. The composite body defined in claim 13 wherein the oxide layer or the diamond-like layer is the outermost layer of said coating.

15. The composite body according to claim 1, wherein said at least one layer of ZrO$_2$ and ZrCN is the outermost layer of said coating.

16. The composite body defined in claim 15 wherein a layer of Al$_2$O$_3$ underlies said outermost layer.

17. The composite body according to claim 1, wherein said coating comprises a layer sequence from the inner side to the exterior of the substrate body with the following thicknesses: TiN: 0.5 to 2 $\mu$m; TiCN: 2 to 5 $\mu$m; ZrCN/ZrO$_2$: 2 to 10 $\mu$m.

18. The composite body defined in claim 17 wherein the TiN layer thickness is up to 1 $\mu$m.

19. A process for producing a two or three phase containing layer on a coated or uncoated substrate body composed of a hard metal, a cermet or a ceramic, by means of a CVD deposition at a temperature between 800° C. to 950° C. with a Zr-halogenide in stoichiometric excess in the gas phase, CO$_2$, hydrogen and a material with a C-N group as a carbon and nitrogen donor at a pressure between 5 kPa and 100 kPa.

20. The process according to claim 19 wherein the C—N molecular group is a cyanide group-CN with a triple bond between the carbon and the nitrogen, whose bond spacing at room temperature is between 0.114 and 0.118 nm.

21. The process defined in claim 20 wherein the carbon and nitrogen donor is acetonitrile.

22. The process according to claim 19 wherein the C—N molecular groups contain molecular groupings with a simple bond between the carbon and the nitrogen.

23. The process according to claim 19 wherein the coating temperature is between 900° C. and 920° C.

24. The process according to claim 19, further comprising varying a CO$_2$ proportion in the gas phase during the coating time 4 for creating a ZrO$_2$ concentration gradient in said layer.

25. The process according to claim 19, further comprising varying a ratio of monoclinic to tetragonal ZrO$_2$ in said layer by adjustment of the coating temperature.

* * * * *